United States Patent
Kim et al.

(10) Patent No.: US 7,649,775 B2
(45) Date of Patent: Jan. 19, 2010

(54) FLASH MEMORY DEVICE APPLYING ERASE VOLTAGE

(75) Inventors: Doo-Gon Kim, Hwaseong-si (KR); Ki-Tae Park, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 171 days.

(21) Appl. No.: 11/970,634

(22) Filed: Jan. 8, 2008

(65) Prior Publication Data

US 2009/0116296 A1 May 7, 2009

(30) Foreign Application Priority Data

Nov. 1, 2007 (KR) .................. 10-2007-0111004

(51) Int. Cl.
*G11C 16/00* (2006.01)
(52) U.S. Cl. .................. 365/185.11; 365/185.23; 365/185.29
(58) Field of Classification Search .................. None
See application file for complete search history.

(56) References Cited

U.S. PATENT DOCUMENTS

| 5,604,697 | A  | * | 2/1997 | Takahashi et al. ........... 365/182 |
| 6,754,124 | B2 | * | 6/2004 | Seyyedi et al. ............. 365/214 |
| 2003/0001230 | A1 | | 1/2003 | Lowrey |
| 2007/0117317 | A1 | | 5/2007 | Ikeda et al. |

FOREIGN PATENT DOCUMENTS

| JP | 2003209222 A | 7/2003 |
| KR | 100232273 B1 | 9/1999 |

* cited by examiner

*Primary Examiner*—Tan T. Nguyen
(74) *Attorney, Agent, or Firm*—Volentine & Whitt, PLLC

(57) ABSTRACT

A flash memory device includes; a plurality of layers, each one including memory cells arranged in a matrix of rows and columns, a layer decoder configured to select one of the plurality of layers to thereby define a selected layer and an unselected layer, a voltage generator configured to generate an erase voltage at a level higher than ground voltage, and an internal voltage, and a row select circuit configured to apply the erase voltage to the selected layer, and apply at least one of the erase voltage and the internal voltage to the unselected layer during an erase operation.

20 Claims, 11 Drawing Sheets

Fig. 4
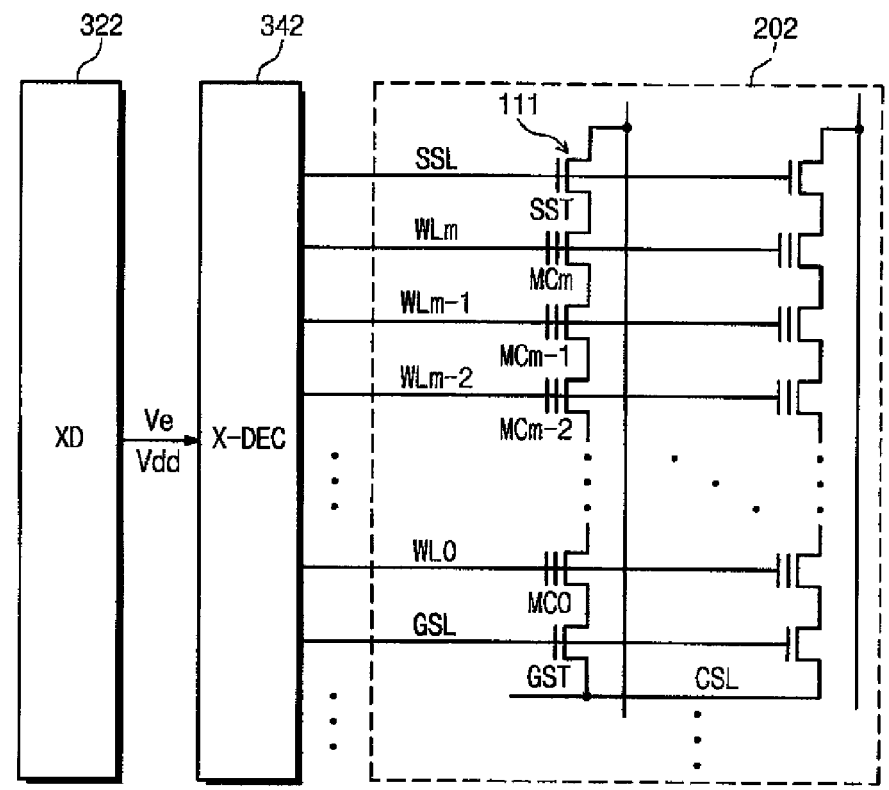
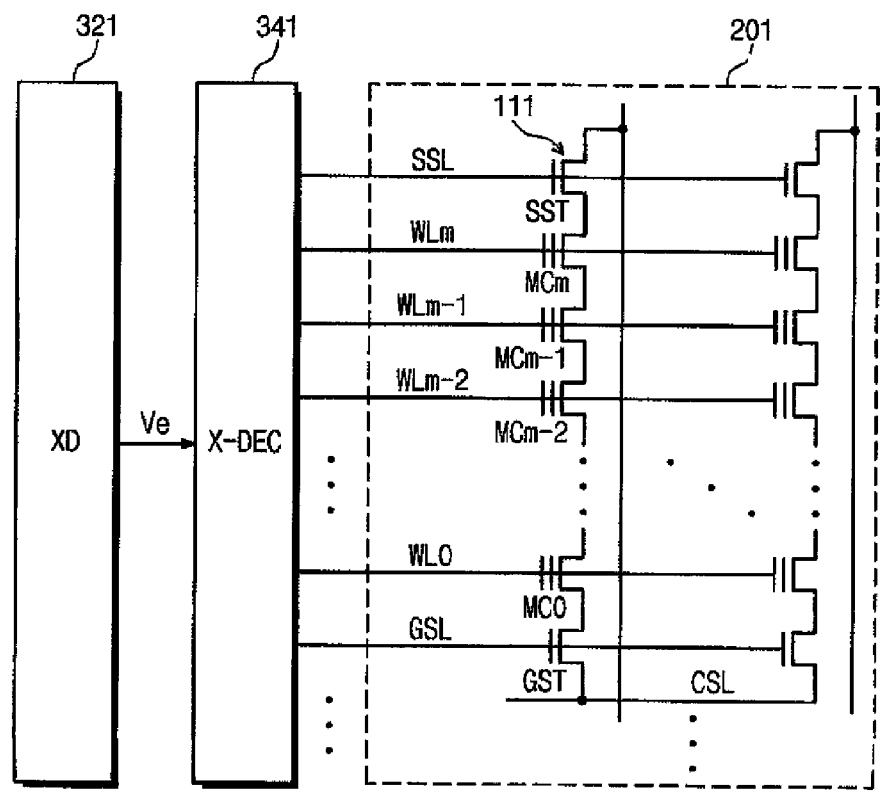

FLASH MEMORY DEVICE APPLYING ERASE VOLTAGE

CROSS-REFERENCE TO RELATED APPLICATIONS

This U.S. non-provisional patent application claims priority under 35 U.S.C § 119 to Korean Patent Application 10-2007-0111004 filed on Nov. 1, 2007, the subject matter of which is hereby incorporated by reference.

BACKGROUND OF THE INVENTION

1. Field of the Invention

The present invention relates generally to flash memory devices. More particularly, the invention relates to a flash memory device capable of preventing the so-called erase disturb phenomenon.

2. Description of the Related Art

Non-volatile memory devices retain stored data even when applied power is interrupted. Flash memory is one form of commonly available non-volatile memory. The block memory erase function provided by flash memory makes it ideal for incorporation into computers, memory cards, consumer electronics, etc.

Conventional flash memory is provided in two principal types; NOR-type and NAND-type, depending on the connection patterns between constituent memory cells and bitlines. NOR-type flash memory is more difficult to densely integrate, but supports relatively higher speed operations. NAND-type flash memory is capable of denser integrated because it generally uses less electrical current during operation of its memory cells.

NAND flash memory includes a memory cell array as a data storage medium. The memory cell array includes a plurality of blocks each comprising a plurality of cell strings (or NAND strings). A typical flash memory cell is implemented on a P-type semiconductor substrate, using N-type source/drain regions separated by a channel region, a floating gate storing charge, and a control gate disposed above the floating gate.

A page buffer circuit is provided in the flash memory to store write data ultimately written to the memory cell array or read data retrieved from the memory cell array. As is well understood in the art, the memory cell of a NAND-type flash memory is erased and programmed using the Folwer-Nordheim tunneling (or "FN tunneling") effect. Typical programming and erase operations associated with contemporary NAND-type flash memory are disclosed, for example, in U.S. Pat. Nos. 5,473,563 and 5,696,717, the collective subject matter of which is hereby incorporated by reference.

Generally speaking, the storing of data in a flash memory cell includes the steps of first erasing the flash memory cell and then programming the erased cell. The erase operation is performed on a memory cell (or a group of memory cells) by applying an erase voltage (e.g., 0V) to the control gate and applying a high voltage (e.g., 20V) to the semiconductor substrate. Under the above voltage condition, FN tunneling occurs to force electrical charge accumulated on the floating gate to the substrate through a tunneling oxide layer separating the floating gate from the substrate.

A typical stack-type flash memory device (hereinafter referred to as "stack flash memory") includes a plurality of memory cell arrays. The stack flash memory includes a layer decoder and a row decoder. The layer decoder selects any memory cell array in response to a received layer address, and the row decoder selects any memory block of the selected memory cell array in response to a received row address.

The row decoder includes select transistors respectively associated with individual wordlines. The control gates of the select transistors respectively corresponding to wordlines of a selected memory block are turned ON when an operation power VDD is applied.

During an erase operation, an erase voltage is applied to wordlines of the selected memory block through the "ON" select transistors. Gates of select transistors respectively corresponding to an unselected memory block of a selected memory cell array and wordlines of an unselected memory cell array remain OFF as they receive a ground voltage VSS. Thus, the unselected memory block of the selected memory cell array and the wordlines of the unselected memory cell array enter a floating state.

Since a substrate voltage is applied to a substrate of a memory cell array during the erase operation, floating wordlines of the unselected memory cell array are each boosted to the substrate voltage. Also the wordlines of the unselected memory blocks of the selected memory cell array are each boosted to the substrate voltage. In this case, a voltage difference between the substrate voltage and a wordline is so small that FN tunneling does not occur. As a result, the erase operation is not performed for memory cells of the unselected memory cell array, and memory cells of the unselected memory blocks of the selected memory cell array.

Generally, a ground voltage is applied to sources of select transistors respectively corresponding to wordlines of an unselected memory cell array during an erase operation. A typical select transistor is a transistor through which subthreshold leakage current (hereinafter referred to as "leakage current", or Isub) flows. The leakage current flowing through the select transistor is proportional to an exponential function eVgs of a gate-source voltage difference of the select transistor. The voltage of wordlines of an unselected memory cell array may drop due to the leakage current through the select transistor. In this case, unselected cells may be erased. This result is referred to as the "erase disturb". An erase voltage is applied to unselected memory blocks of a selected memory cell array, but is not applied to the select transistors because they remain in an OFF state. However, since an erase voltage is applied to sources of the select transistors, memory cells of the unselected memory blocks of the selected memory cell array may also suffer from erase disturb when the erase voltage is a ground voltage.

SUMMARY OF THE INVENTION

Exemplary embodiments of the present invention are directed to a flash memory device.

In one embodiment, the invention provides a flash memory device comprising; a plurality of mats having a plurality of layers each including memory cells arranged in a matrix of rows and columns, layer decoders each corresponding to the mats, and configured to select one of the plurality of layers to thereby define a selected layer and an unselected layer of a corresponding mat, a voltage generator configured to generate an erase voltage at a level higher than ground voltage, and an internal voltage, and row select circuits each corresponding to the mats, and activated selectively in response to a mat selection signal, wherein the activated row select circuit is configured to apply the erase voltage to the selected layer of the corresponding mat, and apply at least one of the erase voltage and the internal voltage to the unselected layer of the corresponding mat during an erase operation.

In another embodiment, the invention provides a flash memory device comprising; a plurality of mats having a plurality of layers each including memory cells arranged in a matrix of rows and columns, layer decoders each corresponding to the mats, and configured to select one of the plurality of layers to thereby define a selected layer and an unselected layer of a corresponding mat, a voltage generator configured to generate an erase voltage at a level higher than ground voltage, and an internal voltage, row select circuits each corresponding to the mats, and activated selectively in response to a mat selection signal, and a mat common driver circuit configured to supply at least one of the erase voltage and the internal voltage to each row select circuits, wherein the activated row select circuit is configured to apply the erase voltage to the selected layer of the corresponding mat, and apply at least one of the erase voltage and the internal voltage to the unselected layer of the corresponding mat during an erase operation.

BRIEF DESCRIPTION OF THE DRAWINGS

FIG. 4 is a block diagram of a row select circuit and memory cell arrays shown in FIG. 2.

DESCRIPTION OF EMBODIMENTS

Embodiments of the invention will now be described in some additional detail with reference to the accompanying drawings. However, the invention may be variously embodied and should not be construed as being limited to only the illustrated embodiments.

Figure 2:
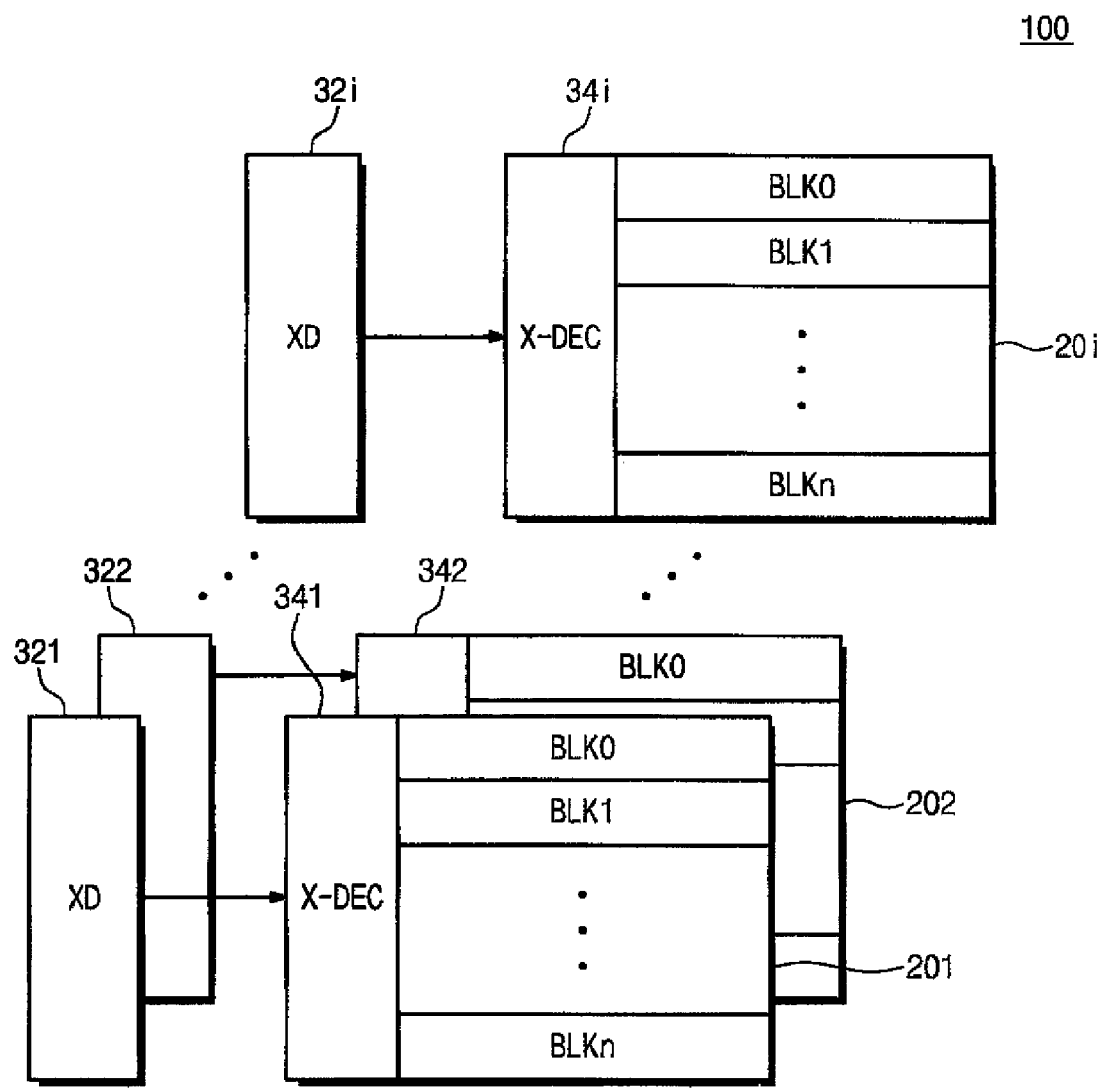
FIG. 2 is a block diagram of a stacked structure of a memory cell array shown in FIG. 1.

Referring to Figures (FIGS.) 1 and 2, a flash memory device 100 according to the first embodiment of the invention is assumed to have a stacked structure. Flash memory device 100 comprises a layer decoder 10, a memory cell array 20, a row select circuit 30, a voltage generator 40, a page buffer 50, and a control logic 60. Since flash memory device 100 has a stacked structure, memory cell array 20 is substantially implemented using a plurality of memory cell arrays. That is, memory cell array 20 comprises a plurality of memory cell arrays 201 through 20i, as shown in FIG. 2. Each of the memory cell arrays 201-20i includes a plurality of memory blocks BLK0-BLKn, each memory block including a plurality of memory cells arranged in a matrix of rows defined in relation to wordlines and columns defined in relation to bitlines.

Row select circuit 30 includes a plurality of row decoders 341-34i and a plurality of driver circuits 321-32i each corresponding to the plurality of memory cell arrays 201-20i. Hereinafter, the plurality of memory cell arrays 201-20i will be referred to as a plurality of layers, and each memory cell array in the stacked collection will be referred to as a layer.

Thus, layer decoder 10 selects any layer in response to externally provided address information.

Voltage generator 40 is controlled by control logic 60 to generate the various voltages required for operations of flash memory device 100. For example, voltage generator 40 is controlled by control logic 60 to generate a program voltage Vpgm and a pass voltage Vpass during program operations and to generate an erase voltage Ve during erase operations. Voltage generator 40 provides the program voltage Vpgm, the pass voltage Vpass, and the erase voltage Ve to row select circuit 30. Also voltage generator 40 generates a plurality of internal voltages and provides at least one of the internal voltages to row select circuit 30. At least one of the internal voltages may have the same level as an applied power supply voltage VDD. The internal voltage supplied to row select circuit 30 will now be described as a power supply voltage VDD but is not limited thereto. For example, one or more of the plurality of internal voltages may be higher than the erase voltage Ve.

Row select circuit 30 selects any memory block of a selected layer in response to an externally provided row address and selects any wordline of the selected memory block. Also row select circuit 30 provides wordline voltages to corresponding wordlines under the control of control logic 60. For example, select circuit 30 may respectively provide the program voltage Vpgm and the pass voltage Vpass to a selected wordline during a program operation, and may provide an erase voltage Ve to wordlines of a selected memory block during an erase operation.

Row address information generally includes block address information. A row decoder corresponding to a selected layer selects any memory block in response to the block address information. Driver circuits 321-32i respectively provide the erase voltage Ve or the internal voltage VDD received from voltage generator 40 to corresponding row decoders 341-34i during an erase operation. An unselected memory block of a selected layer and wordlines of an unselected layer enter a floating state, respectively, which will be described in some additional detail with reference to FIG. 3.

Page buffer circuit 50 is controlled by control logic 60 and includes a plurality of page buffers (not shown) each being connected in conventional manner to bitlines shared by all memory blocks. Also page buffer circuit 50 acts as a sense amplifier and a write driver according to a currently defined operating mode. For example, during a read operation, page buffer circuit 50 senses page data from a page block through bitlines. During a program operation, page buffer circuit 50 latches data to be programmed and correspondingly drives bitlines to ground voltage or a power supply voltage.

Control logic 60 controls the overall operation of flash memory device 100.

During an erase operation, voltage generator 40 provides the erase voltage Ve and internal voltage VDD to row select circuit 30. Each driver circuit from the plurality of driver circuits 321-32i corresponding to an unselected layer provides at least one of the erase voltage Ve and internal voltage VDD to its corresponding row decoder from the plurality of row decoders 341-34i. Each driver circuit corresponding to a selected layer receives the erase voltage Ve from voltage generator 40 and provides it to its corresponding row decoder.

The erase voltage variously supplied to row decoders 341-34i will have a predetermined level higher than ground voltage. (In this context, the phrase "higher than ground voltage" may mean a positive or a negative voltage different from ground—i.e., more positive or more negative in relation to ground). The erase voltage Ve may be set to a level at which FN tunneling occurs. For example, in one embodiment of the invention, the erase voltage Ve generated by voltage generator 40 may fall within a range of from 0V to 0.3V. Thus in the working assumption described above, since the erase voltage of 0.3V has an extremely low level, there is no problem in performing an erase operation. The level of the erase voltage Ve may also be below a critical wordline voltage. The term "critical wordline voltage" is a voltage sufficient to performing a normal erase operation within a particular flash memory device. This critical wordline voltage as well as the resulting erase voltage Ve may be determined for specific embodiments of the invention using empirically derived test data and/or simulation derived test data. Hereinafter, an erase voltage of 0.3V and an internal voltage of 2.2V will be assumed, consistent with current flash memory characteristics, for purposes of description. This of ordinary skill in the art will understand that any other reasonable assumptions may be made for an erase voltage level and an internal voltage level.

A row decoder corresponding to a selected layer applies the erase voltage to respective wordlines of a selected memory block in the selected layer. Thus, memory cells of the selected memory block in the selected layer are erased. However, wordlines of an unselected memory block in the selected layer and wordlines of an unselected layer are placed in a floating state. Thus, the erase voltage Ve or internal voltage VDD supplied to the row decoders 341-34i are not applied to the respective wordlines of the unselected memory block of the selected layer and the unselected layer.

Row decoders 341-34i include a respective select transistors (shown in FIG. 3) corresponding to wordlines. The source of each select transistor corresponding to the wordlines of the unselected memory block of the selected layer or the unselected layer receives the erase voltage Ve or internal voltage VDD. Thus, a gate-source voltage difference Vgs for the select transistors corresponding to the floating wordlines is lower than when ground voltage is applied. As previously described, the leakage current (Isub) flowing through a select transistor is proportional to an exponential function eVgs of its gate-source voltage difference. As a result, leakage current (Isub) of the select transistors decreases. Because the leakage current (Isub) of the select transistors decreases during erase operations, a flash memory device implemented in accordance with an embodiment of the invention will be significantly less likely to suffer from the erase disturb phenomenon.

Figure 3:
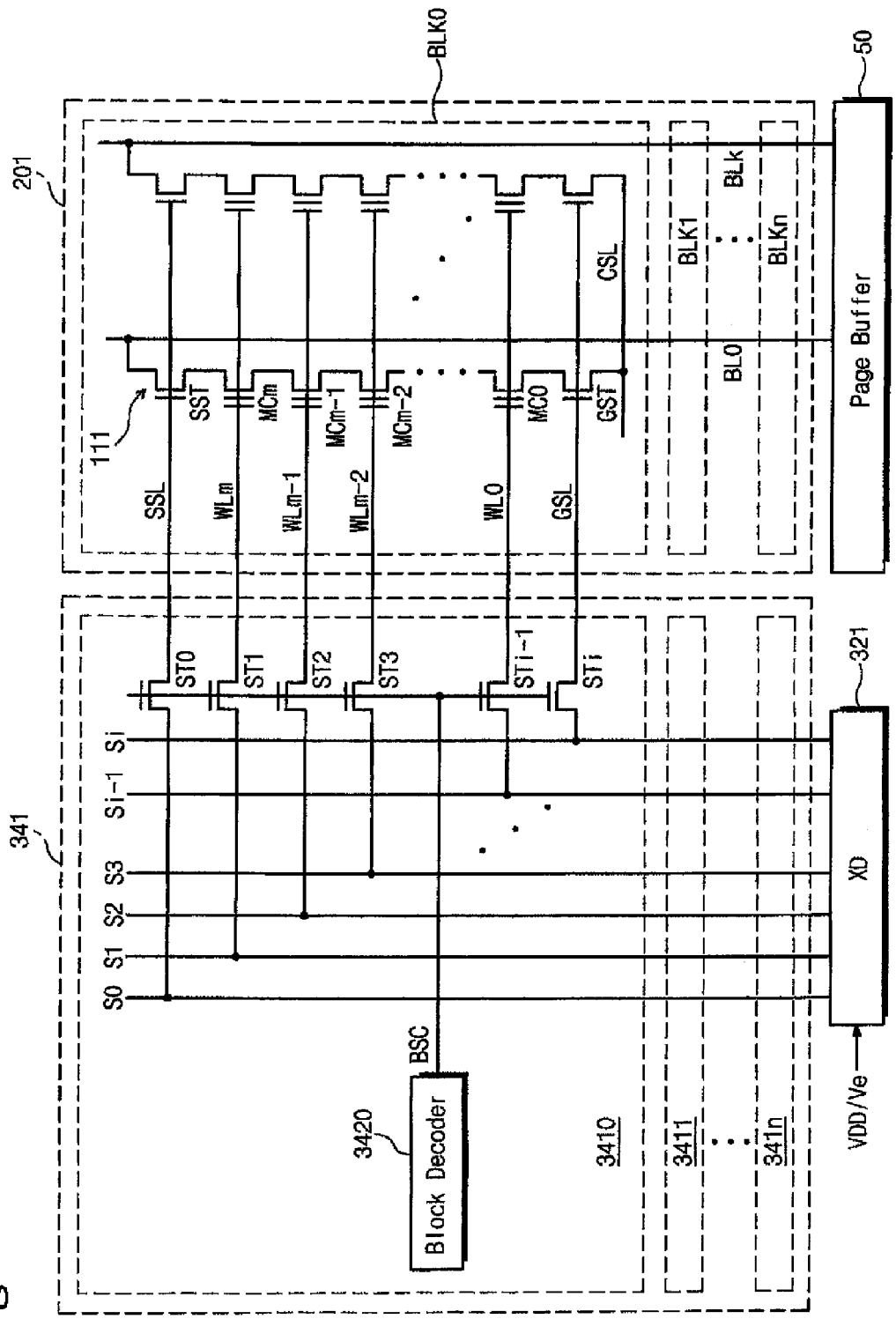
FIG. 3 is a block diagram of a row select transistor associated with a memory block shown in FIG. 2.

FIG. 3 is a block diagram of a row select transistor (e.g., element 341) associated with a memory block (e.g., element 201) shown in FIG. 2. Each row decoder in the plurality of row decoders 341-34i corresponding to layers 201-20i is assumed in the working example to have a similar configuration. The same assumption is made for the plurality of driving circuits 321-32i. Thus, an operative disposition of layer 201 with associated row decoder 341 and driver circuit 321, as shown in FIG. 3, is sufficient to the description of stacked flash memory 100.

Referring to FIG. 3, a memory block BLK0 includes a plurality of strings 111 each including a string select transistor SST, a ground select transistor GST, and a plurality of memory cells (or memory cell transistors) MC0-MCm serially coupled between the select transistors SST and GST. The plurality of strings 111 is respectively connected to corresponding bitlines BL0-BLk. The bitlines BL0-BLk are arranged to be shared by memory blocks BLK0-BLKn of layer 201. In each one of the plurality of strings 111, a string select transistor SST is connected to a string select line SSL and memory cell transistors MCm-MC0 are connected to corresponding wordlines WLm-WL0, respectively.

Row decoder 341 includes a plurality of block select control circuit 3410-341i, each including a block decoder 3420 and select transistors ST0-STi. The block select control circuits 3410-341i are arranged to correspond to the memory blocks BLK0-BLKn, respectively. The string select line SSL, the wordline WLm-WL0, and the ground select line GSL are connected to corresponding select lines S0-Si through the select transistors ST0-STi, respectively.

Driver circuit 321 transfers voltage to corresponding select lines S0-Si in response to received row address information. That is, driver circuit 321 acts as a wordline driver circuit and a wordline decoder.

The gates of the select transistors ST0-STi are commonly connected to a block select line BSC, which is controlled by block decoder 3420. Block decoder 3420 is controlled by control logic 60 and activates or deactivates the block select line BSC in response to received block address information. The select transistors ST0-STi are simultaneously turned ON/OFF in response to the activation or deactivation of the block select line BSC.

Hereinafter, it is assumed that a memory block BLK0 of layer 201 is selected and memory cells of the selected memory block BLK0 are to be erased. Layer 201 is selected by layer decoder 10. A block select signal BSC corresponding to the selected memory block BLK0 is activated (i.e., goes logically "high" in the working example) to select a memory block BLK0 including memory cells to be erased. The select transistors ST0-STi are simultaneously turned ON in response to the activated block select line BSC. As a result, a string select line SST of the selected memory block BLK0 is connected to the string select line SSL and a ground select transistor GST is connected to the ground select line GSL. In addition, memory cell transistors MCm-MC0 are connected to corresponding wordlines WLm-WK0, respectively.

Block select lines BSC corresponding to unselected memory blocks BLK1-BLKn are deactivated to turn ON the select transistors ST0-STi of the block select control circuits 341i-341l. Thus, a string select line SSL, a ground select line GSL, and wordlines WLm-WL0 of the respective unselected memory blocks BLK1-BLKn enter a floating state.

Block select lines BSC of row decoders 342-34i corresponding to unselected layers 202-20i are deactivated to turn OFF respective select transistors ST0-STi of row decoders 342-34i corresponding to the unselected layers 202-20i. Thus, a string select line SSL, a ground select line GSL, and wordlines WLm-WL0 of the respective unselected layers 202-20i enter a floating state.

During an erase operation, a bulk voltage Vbulk is applied to a bulk (or substrate) of layers 201-20i. Thus, wordlines of unselected memory blocks BLK1-BLKn of a floating selected layer 201 and wordlines of unselected layers 202-20i are boosted to the bulk voltage Vbulk.

During the erase operation, driver circuit 321 corresponding to the selected layer 201 receives an erase voltage Ve from voltage generator 40 and applies the received erase voltage Ve to respective wordlines of the memory block BLK0. Thus, memory cells of the selected memory block BLK0 of the selected layer 201 are erased.

The source of select transistors ST1-STi-1 corresponding to the floating unselected memory blocks BLK1-BLKn receives the erase voltage Ve.

As a result, the leakage current flowing through a select transistor is proportional to an exponential function eVgs of its gate-source voltage difference. When the level of an erase voltage Ve is set to 0.3V, a gate-source voltage difference of the select transistors ST1-STi-1 corresponding to the unselected memory blocks BLK1-BLKn of the selected layer 201 is −0.3V. Since the leakage current flowing through the select transistor is proportional to the exponential function eVgs of its gate-source voltage difference, it will further decrease when the gate-source voltage difference is −0.3V, as compared with a gate-source voltage difference is 0V.

Because an erase voltage Ve is provided at a higher level than ground voltage to row decoder 341, the leakage current associated with select transistors ST1-STn-1 corresponding to the wordlines WLm-WL0 of the unselected memory blocks BLK1-BLKn is reduced.

Driver circuits 302-30i corresponding to the unselected layers 202-20i supplies at least one of the erase voltage Ve and internal voltage VDD to the respective row decoders 342-34i. Since the wordlines of the unselected layers 202-20i are in a floating state, when the erase voltage Ve is supplied to the source of each select transistors ST1-STi-1 corresponding to the wordlines WLm-WL0, the resulting leakage current Isub effect described above occurs.

Alternately, driver circuits 302-30i corresponding to the unselected layers 202-20i may supply the internal voltage VDD to the row decoders 342-34i and thus to the source of the selected transistors ST1-STn-1 corresponding to the wordlines WLm-WL0. If the internal voltage VDD supplied to the respective driver circuits 302-30i from voltage generator 40 is 2.2V, a gate-source voltage difference of the select transistors ST1-STi-1 corresponding to the wordlines WLm-WL0 of the unselected layers 202-20i is −2.2V. Since the leakage current flowing through a select transistor is proportional to an exponential function eVgs of its gate-source voltage difference, the leakage current will decrease more when the gate-source voltage difference is −2.2V than when the gate-source voltage difference is 0V.

Thus, because the level of either the erase voltage Ve or the internal voltage VDD is higher than ground voltage, when applied to the row decoders 342-34i corresponding to the unselected layers 202-20i, the leakage current of the select transistors ST1-STi-1 is reduced. Thus, the possibility of flash memory device 100 suffering from an erase disturb is lessened.

FIG. 4 is a block diagram further illustrating layers 201 and 202 of FIG. 2 along with corresponding peripheral circuits, driver circuits 321 and 322 and row decoders 341 and 342.

In the illustrated example, layer 201 is a layer selected during an erase operation. In relation to selected layer 201, voltage generator 40 supplies an erase voltage Ve to row decoder 341 during the erase operation via driver circuit 321. In contrast, driver circuit 322 corresponding to an unselected layer 202 supplies at least one of the erase voltage Ve and internal voltage VDD to row decoder 342. According to the operation of the above-described flash memory device 100, the leakage current associated with the select transistors of floating wordlines in the unselected blocks of selected layer 201 is reduced. Moreover, the leakage current associated with the select transistors of floating wordlines in the unselected layer 202 is also reduced.

Figure 5:
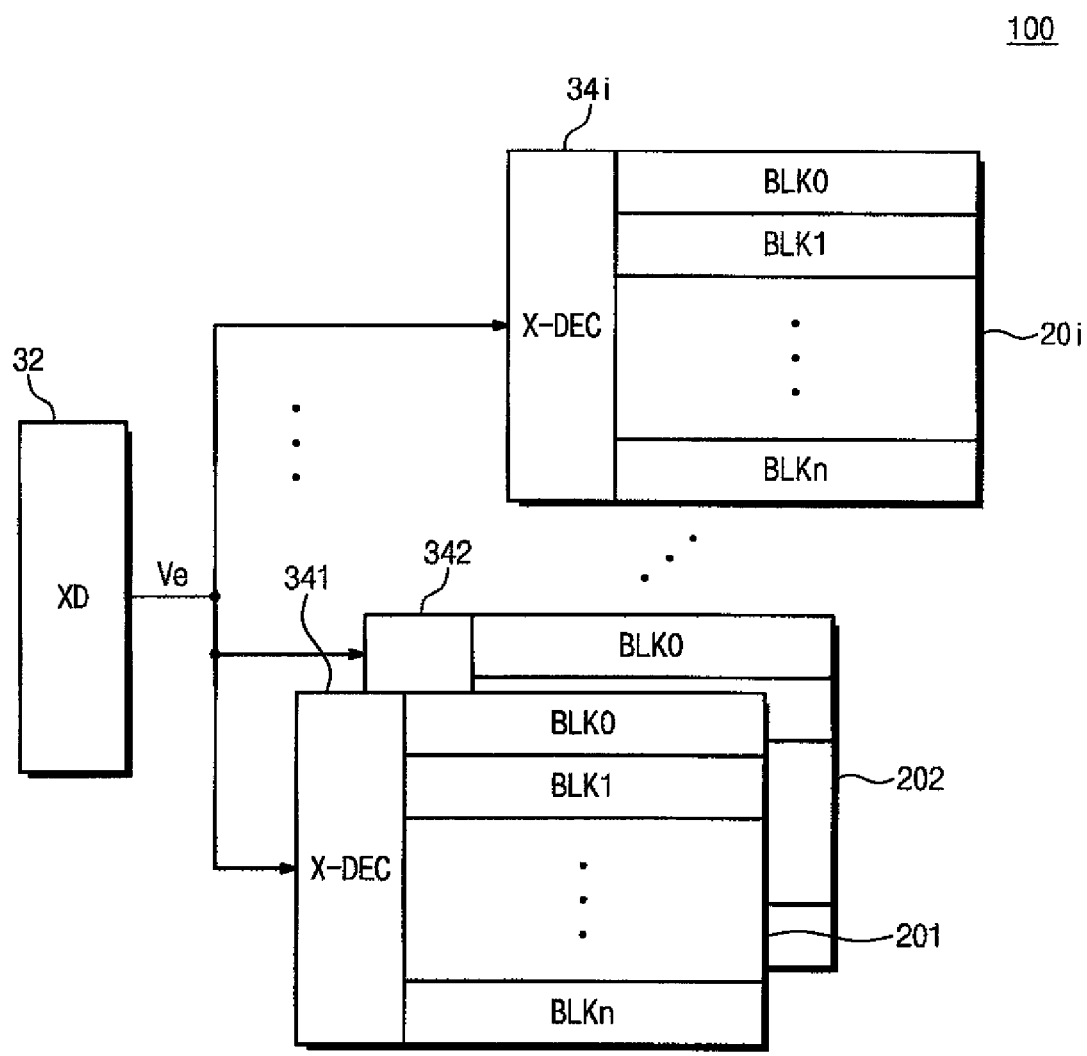
FIG. 5 is a block diagram of a flash memory device according to the second embodiment of the present invention.
Figure 6:
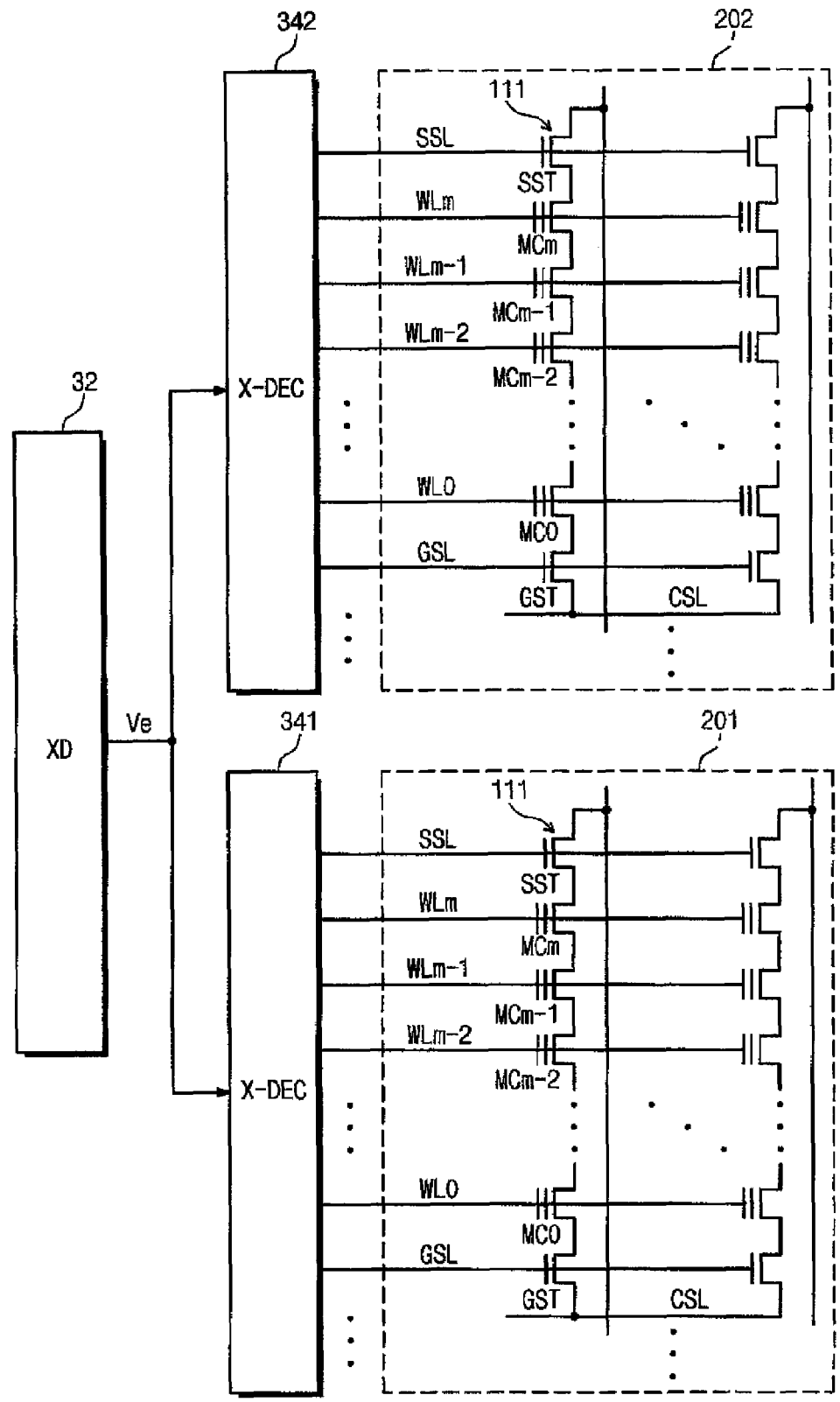
FIG. 6 is a block diagram of a row select circuit and memory cell arrays shown in FIG. 5.

FIG. 5 is a block diagram of a flash memory device according to the second embodiment of the invention. FIG. 6 is a block diagram further illustrating layers 201 and 202 of FIG. 5 as well as corresponding peripheral circuits.

Figure 1:
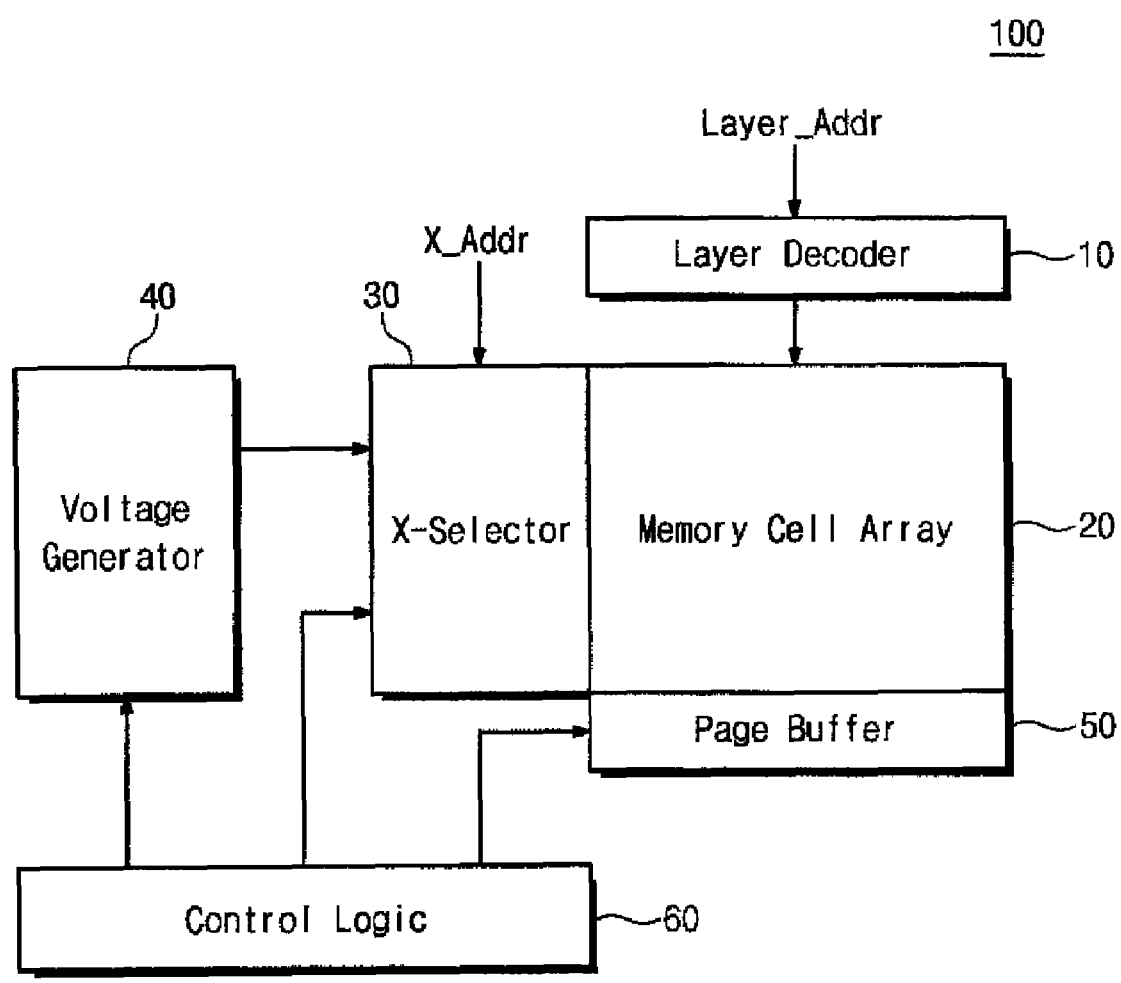
FIG. 1 is a block diagram of a flash memory device according to the first embodiment of the present invention.

Except for the use of a single driver circuit (hereinafter referred to as "common driver circuit") 32, flash memory device 100 shown in FIG. 5 has the same configuration as flash memory device 100 shown in FIGS. 1 and 2. Therefore, as illustrated in FIG. 5, flash memory device 100 includes common driver circuit 32 supplying the erase voltage Ve provide by voltage generator 40 to respective row decoders 341-34i.

FIG. 6 further illustrates layers 201 and 202 and corresponding driver circuits 321 and 322 and row decoders 341 and 342. Layer 201 is again assumed to be a selected layer during an erase operation.

Referring to FIG. 6, common driver circuit 32 supplies the erase voltage Ve to respective row decoders 341-34i of selected layer 201 and the unselected layer 202.

According to the operation of the above-described flash memory device 100, when the erase voltage Ve is set to 0.3V, a gate-source voltage difference of select transistors corresponding to floating wordlines of selected layer 201 and unselected layer 202 is −0.3V. Thus, the leakage current associated with select transistors ST1-STn-1 is reduced to better insulate flash memory device 100 from the erase disturb phenomenon.

In the embodiment illustrated in FIGS. 5 and 6, the internal voltage VDD is not applied to the constituent row decoders in unselected layers during an erase operation. Otherwise, its operation is similar to that of the flash memory device described in relation to FIGS. 1 and 2. Therefore, the erase operation for the flash memory device shown in FIGS. 5 and 6 will not be reiterated.

Embodiments of invention may include one or more layers, and may specifically include a stacked structure. An erase operation for a flash memory device having a single layer structure may be identical to that described above in relation to a selected layer from a stacked structure. That is, a driver circuit may supply an erase voltage, provided by a voltage generator, to a row select circuit, and the row select circuit may then apply the erase voltage to wordlines of a selected block. Further, the source of select transistors corresponding to wordlines in an unselected block receives the erase voltage. Accordingly, the leakage current associated with the select transistors corresponding to the wordlines of the unselected block is reduced. As described above, the erase voltage may be higher than ground voltage. In addition, the erase voltage may be lower than a critical wordline voltage for performing an erase operation using normal FN tunneling.

The foregoing embodiments of a flash memory device reduce leakage current associated with select transistors during an erase operation and largely preclude the erase disturb phenomenon.

Figure 7:
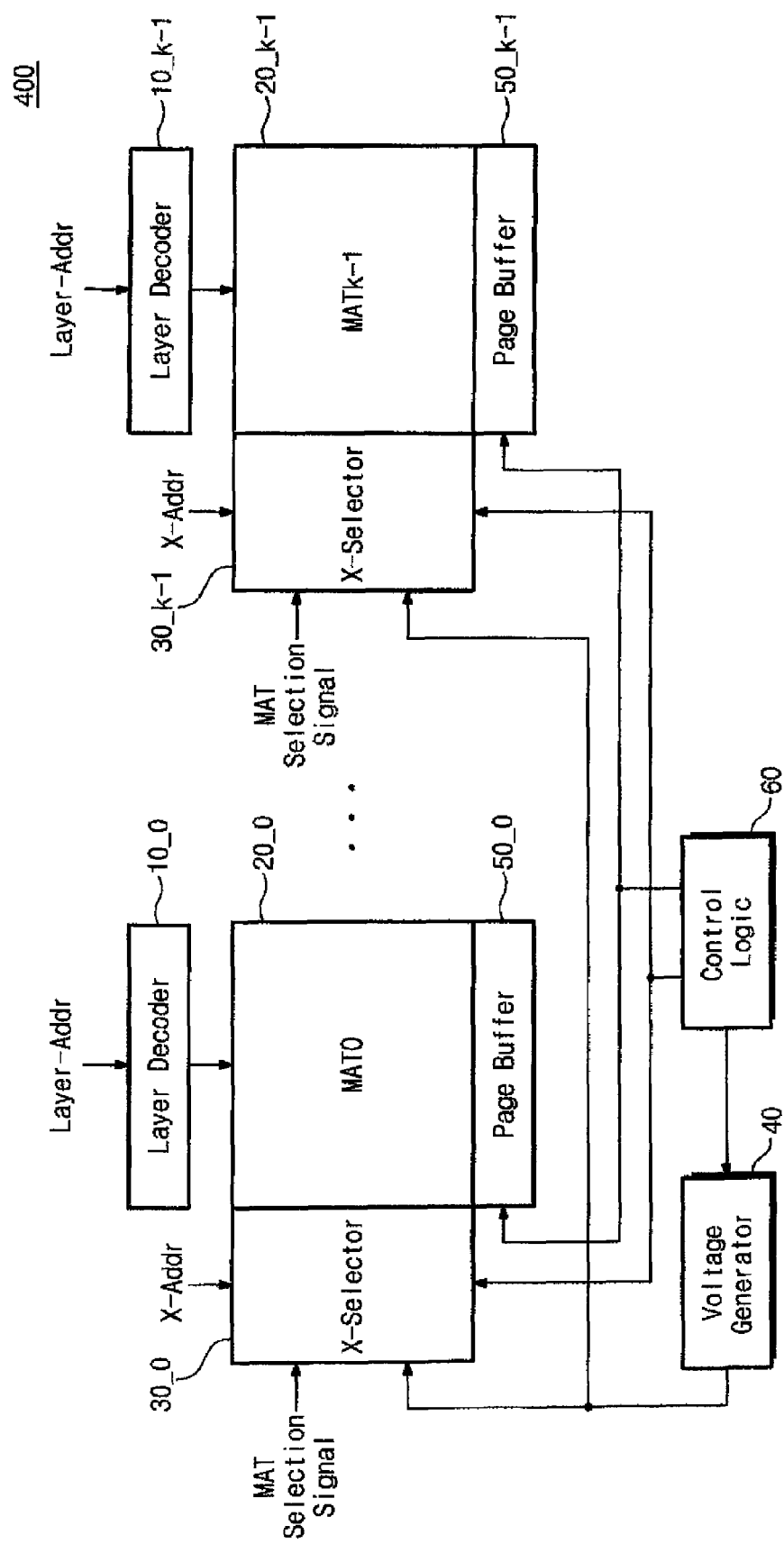
FIG. 7 is a block diagram of a flash memory device according to the third embodiment of the present invention.
Figure 8:
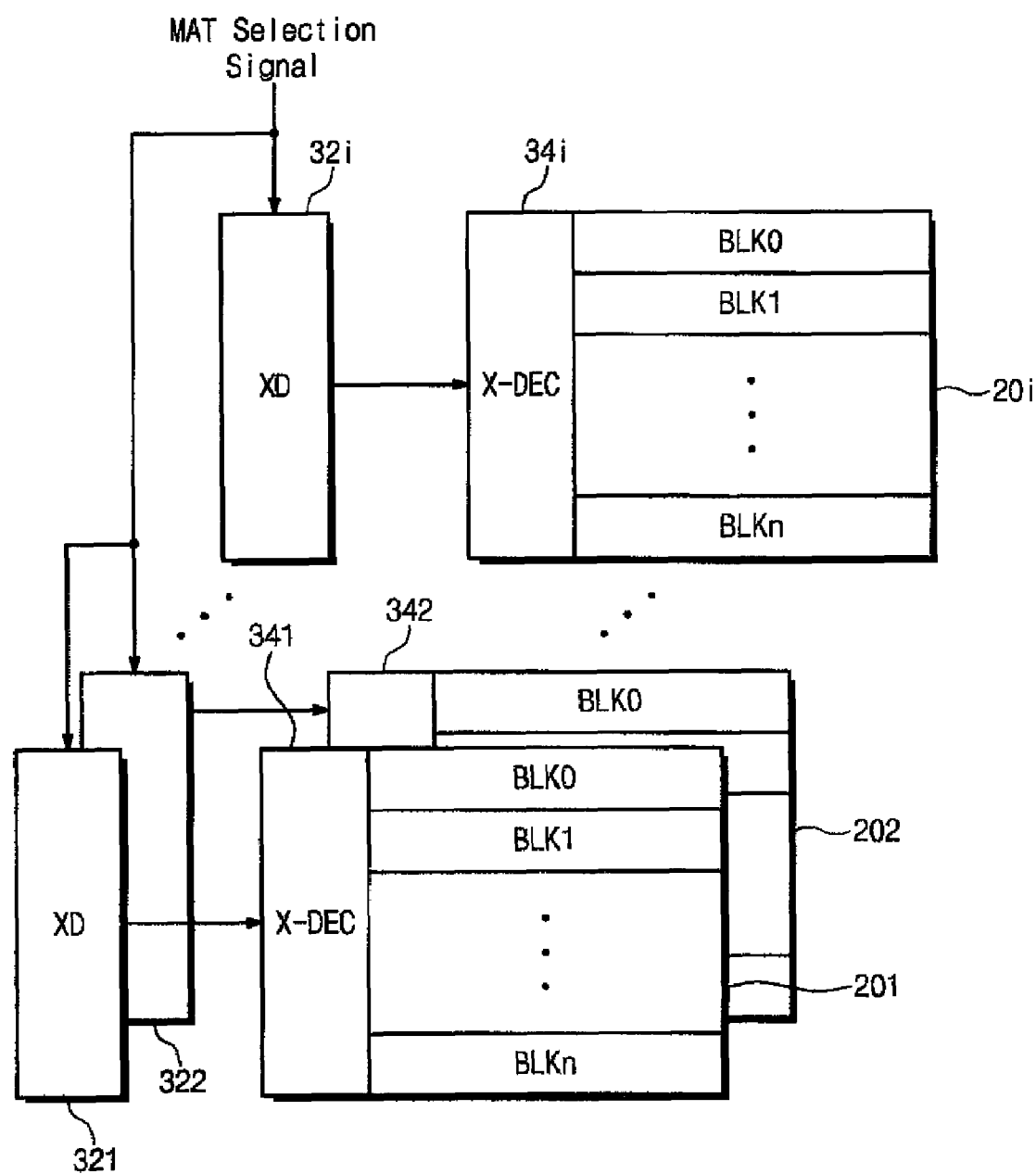
FIG. 8 is a block diagram of a row select circuit and MAT shown in FIG. 7.

FIG. 7 is a block diagram of a flash memory device according to the third embodiment of the present invention and FIG. 8 is a block diagram of a row select circuit and MAT shown in FIG. 7.

Referring to FIGS. 7 and 8, the memory device 400 according to the third embodiment of the invention comprises a plurality of MATs 20_0~20_K-1. The plurality of MATs 20_0~20_K-1 comprise a plurality of layers 201~20i, respectively. Layer decoders 10_1~10_K-1, row select circuits 30_0~30_K-1, and page buffers 50_0~50_K-1 shown in FIG. 7 have the same configuration as layer decoders 10_1~10_K-1, the row select circuit 30, and the page buffer 50 shown in FIG. 1. Also, a voltage generator 40 and a control logic 60 shown in FIG. 7 have the same configuration as the voltage generator 40 and the control logic 60 shown in FIG. 1. each of the row select circuits 30_0~30_K-1 shown in FIG. 8 comprise a plurality of row decoders 341-34i and a plurality of driver circuits 321-32i, as the row select circuit 30 shown in FIG. 2. The plurality of row decoders 341-34i correspond to the plurality of memory cell arrays 201-20*i*, respectively. The plurality of driver circuits 321-32*i* correspond to the plurality of memory cell arrays 201-20*i*, respectively.

During erase operation, for selecting MAT, the row select circuit corresponding to MAT to be erased is activated in response to a MAT selection signal. For example, the MAT selection signal is supplied to respective driver circuits 321~32*i* of each of the row select circuits 30_0~30_K-1. The MAT selection signal has either one of a high level and a low level. In case of performing erase operation of MAT 20_0, an MAT selection signal of the high level is supplied to the row select circuit 30_0. The driver circuits 321~32*i* of the row select circuit 30_0 are activated in response to the MAT selection signal of the high level. The driver circuits 321~32*i* of each of the row select circuits 30_1~30_K-1 are inactivated in response to an MAT selection signal of the low level.

In case layer 201 is selected, the activated driver circuit 321 corresponding to the selected layer 201 supplies the erase voltage Ve to a corresponding row decoder 341. The activated driver circuits 322~32*i* each corresponding to the unselected layers 202~20*i* supply at least one of the erase voltage Ve and an internal voltage VDD to corresponding row decoders 342~34*i*, respectively.

Hereinafter, since erase operation of the selected MAT is similar to that of the flash memory device 100 according to the first embodiment of the present invention, its description will not be reiterated.

Figure 9:
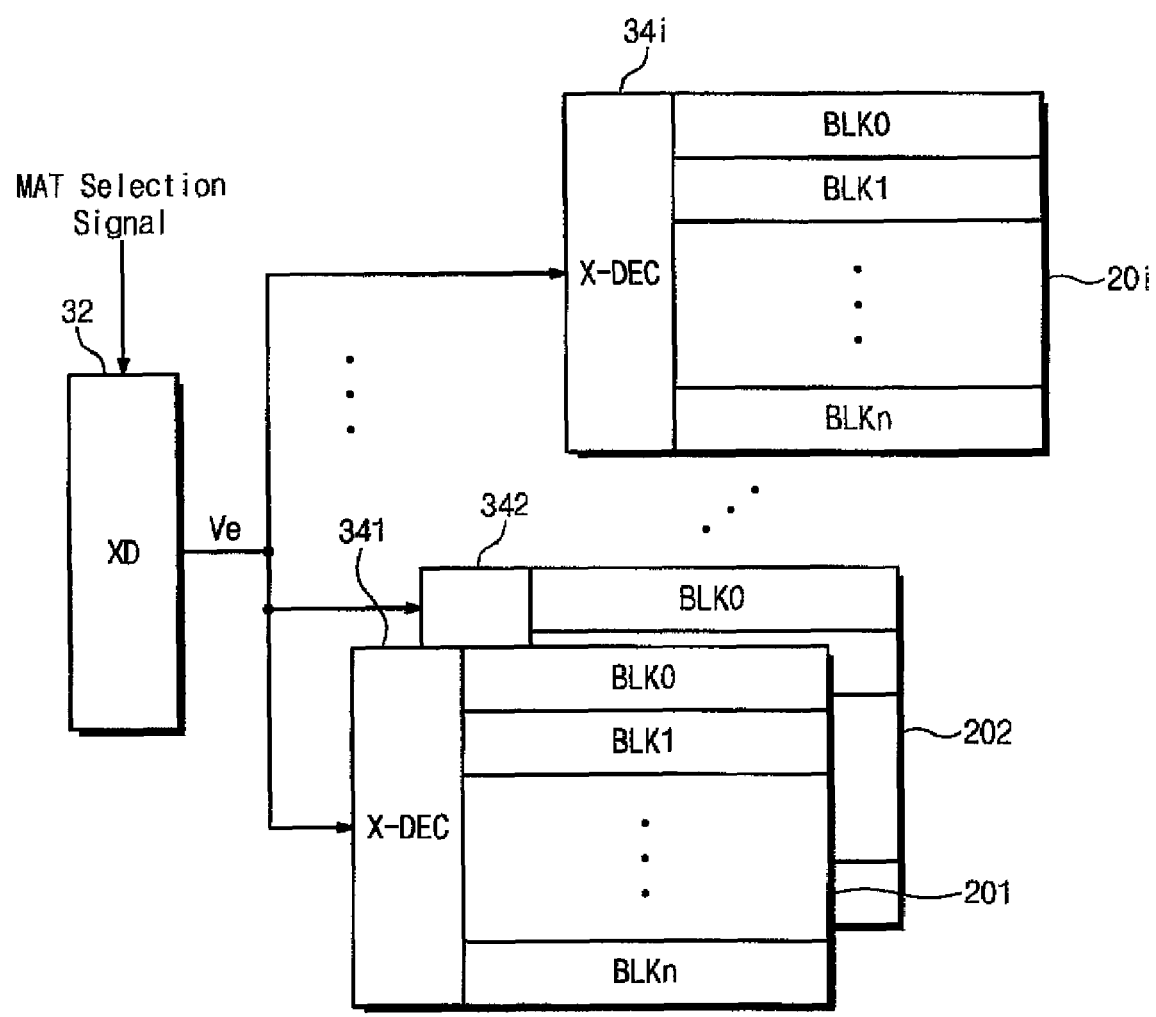
FIG. 9 is a block diagram of a row select circuit and MAT of a flash memory device according to the fourth embodiment of the present invention.

FIG. 9 is a block diagram of a row select circuit and MAT of a flash memory device according to the fourth embodiment of the present invention.

Referring to FIG. 9, each of the row select circuits 30_1~30_K-1 each corresponding to MATs 20_0~20_K-1 comprise a common driver circuit 32. Otherwise, the flash memory device 400 according to the fourth embodiment of the present invention is configured similarly to the flash memory device 400 shown in FIGS. 7 and 8.

During erase operation, for selecting MAT, the row select circuit corresponding to MAT to be erased is activated in response to a MAT selection signal. For example, the MAT selection signal is supplied to each of the common driver circuits 32 of the row select circuits 30_0~30_K-1. In case of erasing MAT 20_0, a MAT selection signal of the high level is supplied to the row select circuit 30_0. The common driver circuit 32 of the row select circuit 30_0 is activated in response to the MAT selection signal of the high level. Each of the common driver circuits 32 in the row select circuits 30_1~30_K-1 is inactivated in response to a MAT selection signal of the low level.

During erase operation, the activated common driver circuit 321 supplies the erase voltage Ve to the row decoders 341~34*i*. Since erase operation of the selected MAT is similar to that of the flash memory device 100 according to the second embodiment of the present invention, its description will not be reiterated.

Figure 10:
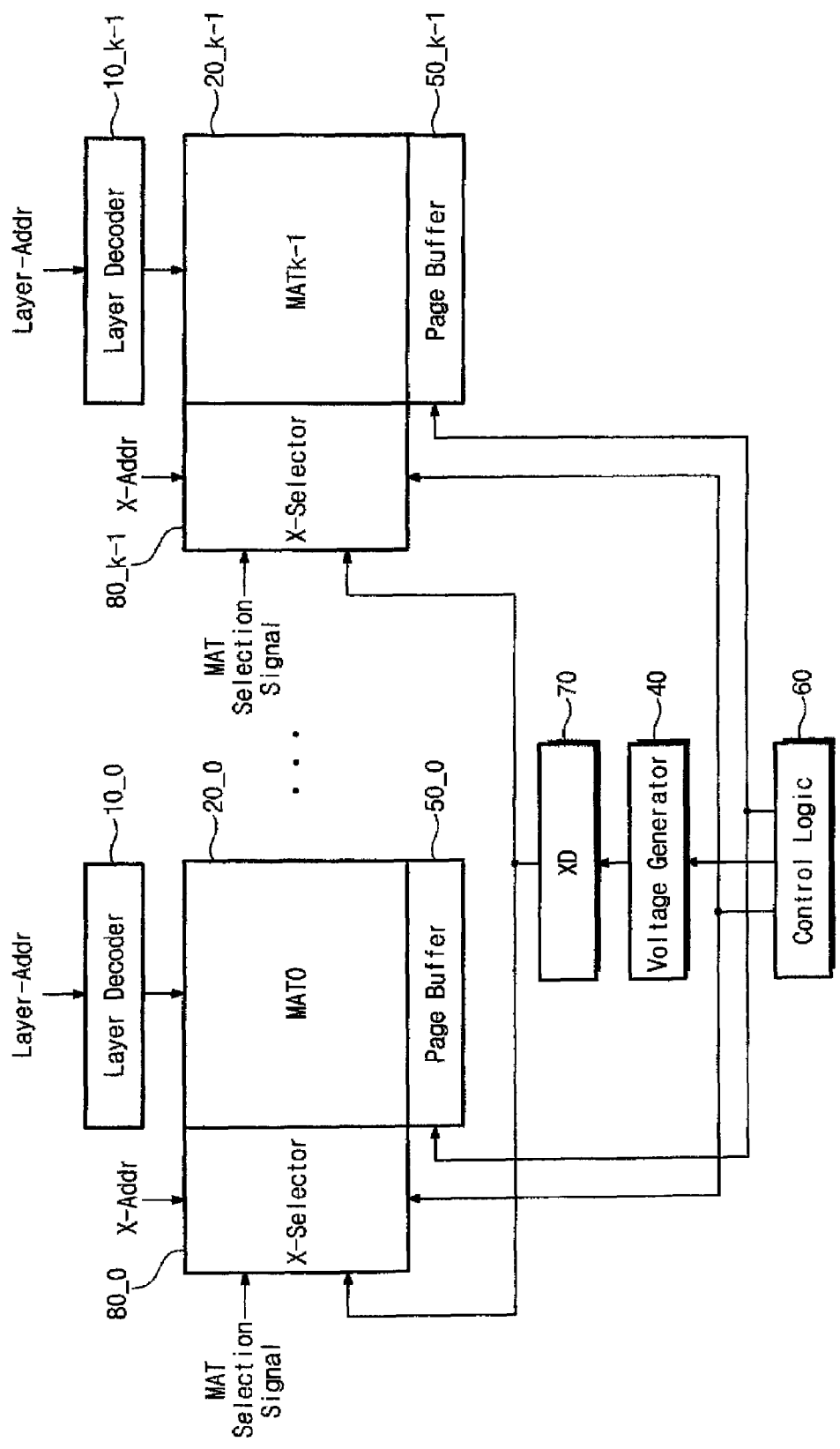
FIG. 10 is a block diagram of a flash memory device according to the fifth embodiment of the present invention.
Figure 11:
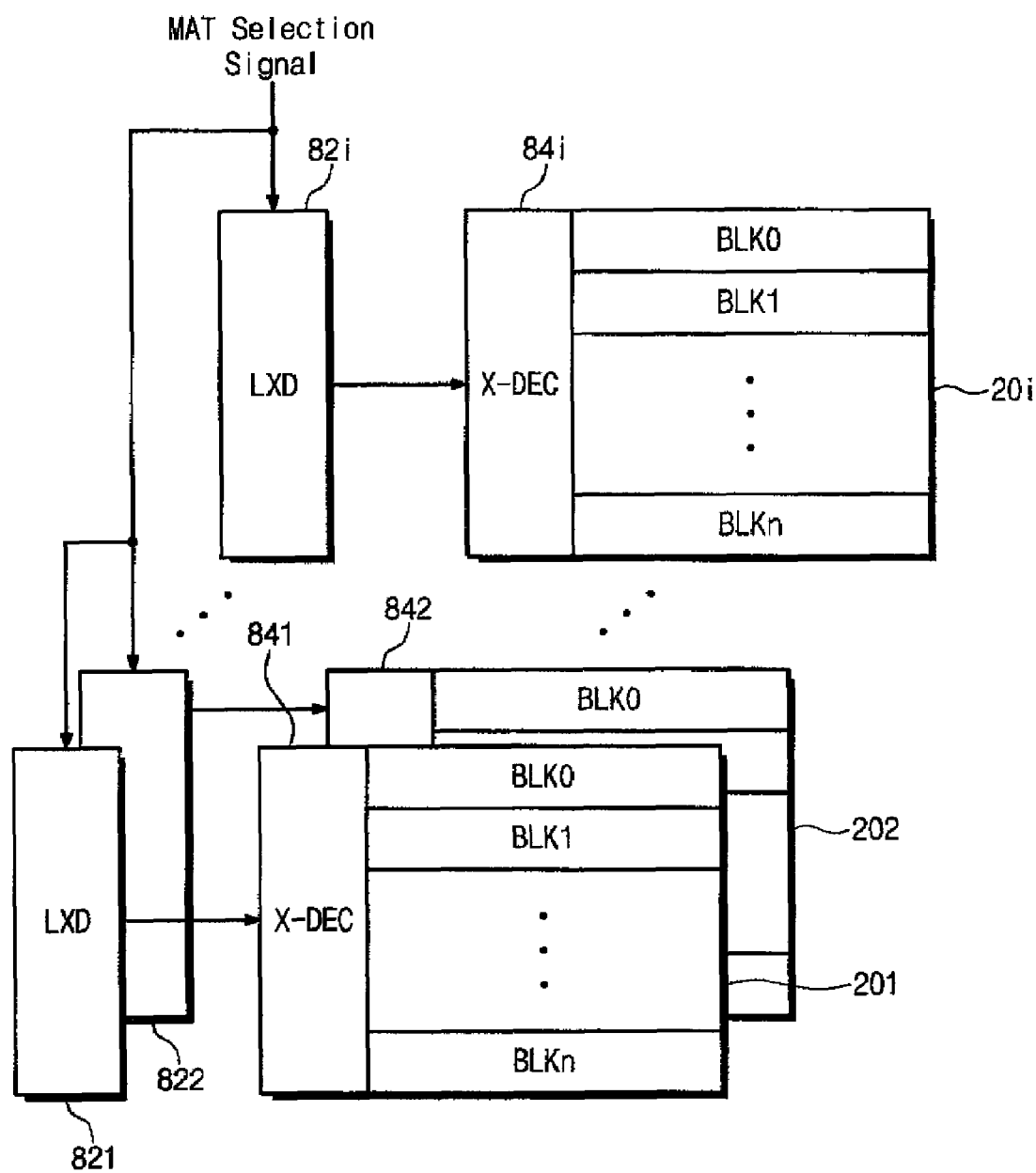
FIG. 11 a block diagram of a row select circuit and MAT shown in FIG. 10

FIG. 10 is a block diagram of a flash memory device according to the fifth embodiment of the present invention, and FIG. 11 a block diagram of a row select circuit and MAT shown in FIG. 10.

Referring to FIGS. 10 and 11, the flash memory device 500 according to the fifth embodiment of the present invention comprises a mat common driver circuit 70 and row select circuits 80_0~80_K-1 each corresponding to MATs 20_0~20_K-1. Layer decoders 10_1~10_K-1, MATs 20_0~20_K-1, page buffers 50_0~50_K-1, a voltage generator 40, and a control logic 60 shown in FIGS. 10 have the same configuration as layer decoders 10_1~10_K-1, MATs 20_0~20_K-1, page buffers 50_0~50_K-1, a voltage generator 40, and a control logic 60 shown in FIG. 6. Row select circuits 80_0~80_K-1 comprise local driver circuits 821~82*i* and row decoders 841~84*i* each corresponding to layers 201~20*i*.

During erase operation, the voltage generator 40 supplies an erase voltage Ve and an internal voltage VDD to the mat common driver circuit 70. The mat common driver circuit 70 supplies at least one of the erase voltage Ve and the internal voltage VDD to the local driver circuits 821~82*i* of the respective row select circuits 80_0~80_K-1.

For selecting MAT, the row select circuit corresponding to MAT to be erased is activated in response to a MAT selection signal. For example, the MAT selection signal is supplied to each of the local driver circuits 821~82*i* of the respective row select circuits 80_0~80_K-1. In case of erasing MAT 20_0, a MAT selection signal of the high level is supplied to the row select circuit 30_0. The local driver circuits 821~82*i* of the row select circuit 30_0 are activated in response to the MAT selection signal of the high level, respectively. The driver circuits 821~82*i* of the row select circuits 80_1~80_K-1 is inactivated in response to the MAT selection signal of the low level.

In case layer 201 is selected, the activated local driver circuit 821 corresponding to the selected layer 201 supplies the erase voltage Ve to a corresponding row decoder 841. The activated local driver circuits 822~82*i* each corresponding to the unselected layers 202~20*i* supply at least one of the erase voltage Ve and the internal voltage VDD to corresponding row decoders 842~84*i*.

Each of the inactivated local driver circuits 821~82*i* of the row select circuits 80_1~80_K-1 shuts the erase voltage Ve and the internal voltage VDD received from the mat common driver circuit 70.

Hereinafter, since erase operation of the selected MAT is similar to that of the flash memory device 100 according to the first embodiment of the present invention, its description will not be reiterated.

Although the present invention has been described in connection with the illustrated embodiments, it is not limited thereto. It will be apparent to those skilled in the art that various substitutions, modifications and changes may be made without departing from the scope of the invention, as defined by the following claims.

What is claimed is:

1. A flash memory device comprising:
a plurality of mats having a plurality of layers, each one including memory cells arranged in a matrix of rows and columns;
layer decoders each corresponding to the mats, and configured to select one of the plurality of layers to thereby define a selected layer and an unselected layer of a corresponding mat;
a voltage generator configured to generate an erase voltage at a level higher than ground voltage, and an internal voltage; and
row select circuits each corresponding to the mats, and activated selectively in response to a mat selection signal,
wherein the activated row select circuit is configured to apply the erase voltage to the selected layer of the corresponding mat, and apply at least one of the erase voltage and the internal voltage to the unselected layer of the corresponding mat during an erase operation.

2. The flash memory device of claim 1, wherein the level of the erase voltage is lower than a critical wordline voltage, and the internal voltage generated by the voltage generator is one of a plurality of internal voltages, and at least one of the plurality of internal voltages has a higher level than the erase voltage.

3. The flash memory device of claim 1, wherein the row select circuits comprise respectively:
   a plurality of driver circuits, each respectively associated with one of the plurality of layers; and
   a plurality of row decoders, each respectively associated with one of the plurality of driver circuits,
   wherein the driver circuit in the plurality of driver circuits of the activated row select circuit corresponding to the selected layer supplies the erase voltage to an associated row decoder, and the driver circuit in the plurality of driver circuits of the activated row select circuit corresponding to the unselected layer supplies at least one of the erase voltage and the internal voltage to an associated row decoder.

4. The flash memory device of claim 3, wherein each one of the plurality of row decoders comprises a plurality of select transistors respectively corresponding to a plurality of wordlines in an associated layer, wherein the plurality of select transistors are turned ON/OFF by a decoded block address.

5. The flash memory device of claim 4, wherein a selected wordline in the plurality of wordlines of the selected layer receives the erase voltage when a corresponding select transistor in the plurality of select transistors is ON in relation to the decoded block address.

6. The flash memory device of claim 4, wherein select transistors corresponding to unselected wordlines in the plurality of wordlines of the select layer and wordlines of the unselected layer are OFF in relation to the decoded block address.

7. The flash memory device of claim 6, wherein a source of select transistors corresponding to unselected wordlines of the selected layer receive the erase voltage.

8. The flash memory device of claim 6, wherein sources of select transistors corresponding to wordlines of the unselected layer receive either the erase voltage or the internal voltage.

9. The flash memory device of claim 1, wherein the row select circuit applies the erase voltage to wordlines of the unselected layer.

10. The flash memory device of claim 9, wherein the row select circuits comprise respectively:
    a single common driver circuit; and
    a plurality of row decoders, each respectively associated with one of the plurality of layers,
    wherein the common driver circuit of the activated row select circuit supplies the erase voltage received from the voltage generator to at least one of the plurality of row decoders of the activated row select circuit.

11. The flash memory device of claim 10, wherein the each one of the plurality of row decoders comprises a plurality of select transistors, each respectively associated with one of a plurality of wordlines, and being turned ON/OFF in relation to a decoded block address.

12. The flash memory device of claim 11, wherein select transistors associated with unselected wordlines of the selected layer and wordlines associated with the unselected layer are OFF in relation to the decoded block address.

13. The flash memory device of claim 12, wherein the sources of select transistors corresponding to the unselected wordlines of the selected layer and the wordlines of the unselected memory cell array receives the erase voltage.

14. A flash memory device comprising:
    a plurality of mats each having a plurality of layers each including memory cells arranged in a matrix of rows and columns;
    layer decoders each corresponding to the mats, and configured to select one of the plurality of layers to thereby define a selected layer and an unselected layer of a corresponding mat;
    a voltage generator configured to generate an erase voltage at a level higher than a ground voltage, and an internal voltage;
    row select circuits each corresponding to the mats, and activated selectively in response to a mat selection signal; and
    a mat common driver circuit configured to supply at least one of the erase voltage and the internal voltage to each of the row select circuits,
    wherein the activated row select circuit is configured to apply the erase voltage to the selected layer of the corresponding mat, and apply at least one of the erase voltage and the internal voltage to the unselected layer of the corresponding mat during an erase operation.

15. The flash memory device of claim 14, wherein the level of the erase voltage is lower than a critical wordline voltage.

16. The flash memory device of claim 14, wherein the row select circuits comprise respectively:
    a plurality of local driver circuits, each respectively associated with one of the plurality of layers; and
    a plurality of row decoders, each respectively associated with one of the plurality of driver circuits,
    wherein the local driver circuit in the plurality of local driver circuits of the activated row select circuit corresponding to the selected layer supplies the erase voltage to an associated row decoder, and the local driver circuit in the plurality of local driver circuits of the activated row select circuit corresponding to the unselected layer supplies at least one of the erase voltage and the internal voltage to an associated row decoder.

17. The flash memory device of claim 16, wherein the row decoder includes select transistors respectively corresponding to the wordlines, wherein the select transistors are turned ON/OFF in relation to a decoded block address.

18. The flash memory device of claim 17, wherein select transistors corresponding to unselected wordlines are OFF in relation to the decoded block address.

19. The flash memory device of claim 18, wherein sources of select transistors corresponding to the unselected wordlines receive the erase voltage.

20. The flash memory device of claim 14, wherein the inactivated row select circuits are configured to shut the erase voltage Ve and internal voltage VDD received from the mat common driver circuit 70.

* * * * *